United States Patent [19]

Wortmann et al.

[11] 4,170,508

[45] Oct. 9, 1979

[54] PROCESS FOR MAKING SELF-EXTINGUISHING LAMINATES

[75] Inventors: Joachim Wortmann, Türnich; Burkhard Schönrogge, Hamburg; Joseph Cremer, Hürth; Franz-Josef Dany, Erftstadt, all of Fed. Rep. of Germany

[73] Assignee: Hoechst Aktiengesellschaft, Hurth-Knapsack, Fed. Rep. of Germany

[21] Appl. No.: 919,472

[22] Filed: Jun. 27, 1978

[30] Foreign Application Priority Data

Jun. 30, 1977 [DE] Fed. Rep. of Germany ....... 2729527

[51] Int. Cl.$^2$ .............................................. C09J 5/02
[52] U.S. Cl. .................................... 156/308; 156/335; 260/45.9 NP; 264/134; 264/137; 264/258
[58] Field of Search ................ 260/45.9 NP; 264/137, 264/134, 258; 156/308, 335

[56] References Cited

U.S. PATENT DOCUMENTS

| 3,323,944 | 6/1967 | Senez | 260/45.9 NP |
| 3,383,267 | 5/1968 | Sundén | 260/45.9 NP |

FOREIGN PATENT DOCUMENTS 2311180 9/1974 Fed. Rep. of Germany.
2426862 2/1976 Fed. Rep. of Germany.

Primary Examiner—James H. Derrington
Attorney, Agent, or Firm—Connolly and Hutz

[57] ABSTRACT

Self-extinguishing laminates are made by an improved process, wherein individual layers of a carrier material are impregnated with a thermosetting phenolic resin containing a flame-retardant agent and the impregnated layers are placed one above another and bonded together by compressing them at elevated temperature and under elevated pressure to give a hardened laminate. More specifically, finely pulverulent phosphorus pentanitride as a flame-retarding agent is dispersed in the plasticized or non-plasticized thermosetting phenolic resin, with or without a diluent; the phenolic resin, based on its solid matter content, and the phosphorus pentanitride being used in an approximate ratio by weight of 100:4 to 100:15; and the phenolic resin, based on its solid matter content, and the carrier being used in an approximate ratio by weight of 100:80 to 100:150.

7 Claims, No Drawings

PROCESS FOR MAKING SELF-EXTINGUISHING LAMINATES

This invention relates to a process for making self-extinguishing synthetic resin laminates.

Incombustible or self-extinguishing properties are being increasingly demanded of laminates which are intended for use as carrier materials for printed electric circuits. Their flame-resistance can be evaluated by the method of Underwriters Laboratories Inc., Vertical Burning Test for Classifying Materials 94 V-0, 94 V-1, February 1974, briefly termed "UL 94" hereinafter.

In this test, the lower end of a specimen held in a vertical position is exposed over a period of 10 seconds to the action of a defined flame.

Typical of burning class V-0 is a burning time of at most 10 seconds after removal of the igniting flame, and an overall burning time of 50 seconds after 10 ignitions of altogether 5 specimens.

Typical of burning class V-1 is a burning time of at most 30 seconds after removal of the igniting flame, and an overall burning time of 250 seconds after 10 ignitions of altogether 5 specimens.

The properties which laminates intended for use as carrier materials for printed electric circuits ought to possess have been defined in NEMA Specification, part 10, page 8, June 1976, for FR-2-laminates, and in DIN Standard (DIN stands for German Industrial Standard) No. 40 802.

Heretofore, the necessary flame-retardant properties have been conferred upon laminated paper based on phenolic resins with the use of melamine resins or phosphoric acid esters, such as triphenyl phosphate or diphenylcresyl phosphate, in admixture with a halogen-containing substance and antimony trioxide.

The halogen-containing substances used heretofore exlusively comprise aromatic bromine compounds, such as pentabromodiphenyl ether or bromine-containing epoxide resins, based on tetrabromobisphenol A, for example. These compounds have the thermal stability necessary to avoid or at least substantially avoid the decomposition of the laminate at a moulding temperature of 150° to 170° C. and a solder bath temperature of about 260° C., so that halogen-containing decomposition products are not likely to cause electrolytic corrosion of the laminate or otherwise to affect adversely its electric and dielectric properties; nor is there likely to be an adverse effect upon the bond between the laminate and a copper sheet or film applied to the laminate. Despite this, a barrier sheet, free from halogen-containing flame-retardant agents, has normally to be placed between the copper sheet or film and the halogen-containing laminate, in order to exclude any weakening of the bond between the laminate and the copper sheet or film applied to it.

On the other hand, it is possible to render laminates flame-retardant by the use of appropriate quantities of the above compounds which, however, have to be selected with due regard to the characteristics of the particular phenolic resin employed.

Laminated papers based on phenolic resins which are intended for use as a carrier material for printed electric circuits are normally required to be readily punchable at room temperature. To this end, it is necessary to employ heavily plasticized resins for making the laminated paper, the plasticizers normally used comprising natural oils, e.g. wood oil. Even in those cases, however, in which use is made of flame-retardant agents containing high proportions of bromine and antimony trioxide, it is very difficult to flameproof the above resins to the extent necessary to ensure compliance with the requirements applying to burning class V-0. In the UL 94 burning test, the after-burning times for these resins were found to differ seriously from one specimen to another. Characteristic of this was a flame creeping gradually upwardly along the edge of the specimen.

A formulation for making laminated paper with the use of pentabromodiphenylether (BROMKAL 70-5 DE; this is a registered Trade Mark) has been described in a leaflet of Chemische Fabrik Kalk GmbH., Köln.

Chlorine-containing aromatic compounds are injurious to health and therefore not suitable for use as flame-retardant agents.

Aliphatic halogen compounds lack stability to heat and for this reason are unsuitable for use.

The use of melamine resins alone as flame-retardant agents is possible only in those cases in which no serious demands are made in respect of the punchability of the laminated paper. If employed in high proportions, the melamine resins cause considerable embrittlement of the laminated paper. Thus they find limited use only as an additional flame-retardant agent in halogen-containing binder systems.

Freedom from halogen compounds is the property which has most recently been demanded of flame-retardant laminates. The reason for this is that, in the event of an outbreak of fire, electronic devices are liable to be more seriously damaged by halogenated hydrocarbons than by the fire itself.

It is for this reason that laminate manufacturers have attempted to increase the proportion of melamine resins and phosphoric acid esters in the resin, and to reduce its content of wood oil, and in this manner to improve the quality of the laminates. This however is possible only at the expense of certain desirable properties of the laminate, namely at the price of impaired punchability and resistance to solvents.

German Pat. ("Offenlegungsschrift") No. 2426862 describes a process for making flame-retardant laminates, wherein cellulose-containing material is impregnated with a phenolic resin solution, a plasticizer and optionally a flame-retardant agent, the impregnated material is dried and the resin precondensed, and various superimposed layers of the impregnated and precondensed material are hardened under heat and pressure, which process comprises using a phenolic resin solution which contains:

(a) an ammonia-condensed phenolic resol resin with a solid matter content of 50 to 80 weight %; and
(b) hexamethylene tetramine in proportions of 1 to 15 weight %, based on the impregnating solution.

As can be seen from Table 1 in the above German Pat. No. 2426862, one has to use the impregnating solution in admixture with a relatively large proportion of hexamethylene tetramine to produce a satisfactory flame-retardant effect.

We have now found, in accordance with our present invention, that the disadvantages associated with the use of the above flame-retardant agents in synthetic resin laminates can be obviated by the use of phosphorus pentanitride as the flame-retardant agent.

Although it has been indicated in German Pat. No. ("Offenlegungsschrift") 2311180 that phosphorus pentanitride can be used for the flame-proofing of regenerated-cellulose fibres, there has been no suggestion that one might use this compound for the manufacture of self-extinguishing synthetic resin laminates. Indeed, the nitride would not have been expected to be compatible with the resin ingredient of the laminates under the processing conditions employed, e.g. at the high temperatures and pressures used. In addition to this, phosphorus pentanitride is a nitrogen-containing compound, just as the known melamine resins are, and its incorporation into laminates would therefore have been expected to cause effects analogous to those of melamine resins, namely undesirable embrittlement of the laminates; however, we have found that unexpectedly these effects do not occur.

The present invention provides a process for making a self-extinguishing synthetic resin laminate, wherein individual layers of a carrier material are impregnated with a thermo-setting phenolic resin containing a flame-retardant agent, with or without a diluent, and the impregnated layers are placed one above another and bonded together by compressing them at elevated temperature and under elevated pressure to give a hardened laminate, characterised in that: finely pulverulent phosphorus pentanitride as a flame-retarding agent is dispersed in the plasticized or non-plasticized thermo-setting phenolic resin, with or without a suitable diluent; the phenolic resin, based on its solid matter content, and the phosphorus pentanitride being used in an approximate ratio by weight of 100:4 to 100:15; and the phenolic resin, based on its solid matter content, and the carrier being used in an approximate ratio by weight of 100:80 to 100:150.

A preferred feature of the present process provides for the phenolic resin to comprise a plasticized or non-plasticized thermosetting phenolic resol which is based on a synthetic phenol. It is also possible to dilute the phenolic resin with methanol, ethanol, acetone, toluene, or another solvent, e.g. a mixture of toluene with one or more of the aliphatic solvents just specified or some still further solvent. It is also advantageous to use the phenolic resin and phosphorus pentanitride in a ratio by weight of 100:6 to 100:10, based on the solid matter content of the resin, and to use the phenolic resin and carrier, which may comprise (e.g.) a cotton cellulose paper, sodium kraft paper or cotton fabric, in a ratio by weight of 100:100 to 100:130, based on the solid matter content of the resin. The carrier may be preimpregnated with a phenolic resin free from flame-retardant agent.

The laminates made in accordance with this invention can be made by any applicable procedure provided that phosphorus pentanitride is substituted for any prior-art flame-retardant agent in the impregnating liquor. One applicable procedure has been described, for example, in a leaflet entitled PHENODUR PR 121 (this is a registered Trade Mark) published by Hoechst Aktiengesellschaft, Frankfurt am Main; and another applicable procedure has been described in a leaflet entitled DUROPHEN VPP 93 (this is a registered Trade Mark) published by Reichhold Albert Chemie AG., subsequently merged with Hoechst Aktiengesellschaft.

As described therein, a cotton substitute paper, for example, is first impregnated with an aqueous impregnating base resin so as to apply altogether about 12 to 16 weight % of resin, based on the weight of the paper, and then dried. Next, the preimpregnated paper is dipped into a resin solution containing a flame-proofing agent, or the solution is applied to the carrier by means of a roller, and the carrier material so impregnated is dried at temperatures of at most 140° C. The total quantity of preimpregnating resin plus the quantity of subsequently applied resin, is in typical cases 110 to 120% of the weight of the carrier. The impregnated layers so obtained are placed one above the other and compressed, e.g. under a pressure of about 50 to 100 kg/cm$^2$, at temperatures of 150° to 160° C. and over a period of about 60 to 90 minutes. The resulting laminate is cooled.

The flame-retardant agent which is used in accordance with this invention for making self-extinguishing laminates compares favorably with the prior-art flame-proofing agents in that carrier material which has been treated with a phenolic resin containing considerable proportions of wood oil can be treated even with relatively small quantities of phosphorus pentanitride and rendered flame-proof, so that it reliably complies with the specifications of burning class V-0 of UL 94.

The process of the present invention is more fully illustrated in the following Examples. The phenolic resins used therein comprise commercially available DUROPHEN VPP 93 and PHENODUR PR 121. PHENODUR PR 121 is a non-plasticized thermosetting phenolic resin which is commercially available in the form of a 65% solution in methanol. It has a dynamic viscosity at 20° C. of 400 to 600 centipoises (DIN-test 53 015), a density at 20° C. of 1.076, and a flash point of 10° C. (DIN-test 53 213). DUROPHEN VPP 93 has the following characteristic properties:

| | |
|---|---|
| Viscosity at 20° C. (DIN-test 53 015) | 200–300 cp |
| Specific resistance of a 50 wgt % solution in ethanol | $3.10^5$ ohm . cm |
| Specific density (g/ml) at 20° C. | 1.025 |
| Flash point (DI-test 53 213) | < 30 2° C. |

Solubility: completely soluble in acetone, a 1:1 mixture of methanol and toluene, and a 1:1 mixture of ethanol and toluene; vey soluble in ethanol; difficulty soluble in methanol and toluene.

The resin is commercially available in the form of an approximately 65% solution in a 1:1 mixture of methanol and toluene.

The carrier material was preimpregnated, in the following Examples, with the phenolic resin PHENODUR 271, which has the following characteristic properties:

| | |
|---|---|
| Burning residue (DIN-test 53 182) (1g, 1 h at 100° C. | about 68% |
| Dynamic viscosity at 20° C. (DIN-test 53 015) | 150–250 cp (mPas) |
| Density at 20° C. (g/ml) | about 1.22 |

EXAMPLE 1: (Comparative Example)

8 layers of a cotton substitute paper, of which each weighed 120 g, were preimpregnated with an aqueous phenolic resin (PHENODUR PR 271, a commercially available product of Hoechst Aktiengesellschaft). This preimpregnating resin was used in a proportion of 15 g per 100 g of paper. In other words, 15 weight % of resin, based on the weight of the paper, was applied. The preimpregnated paper was dried for 20 minutes at 120° C. Next, the dry paper was dipped in a resin liquor which was a mixture of 386 g of DUROPHEN VPP 93 (in the form of a 65 weight % solution in a 1:1 mixture of methanol and toluene) and 49 g of a bromine-containing epoxide resin which contained 49 weight % of bromine, based on tetrabromobisphenol A. The preimpregnating resin and the subsequently applied resin were applied in a total proportion of 110%, based on the weight of the paper. The resin-containing paper was dried, and the binder was simultaneously condensed further at 150° C. over a period of 5 to 7 minutes, to make possible the necessary degree of flux of the resin in the compression stage. 8 layers of the cotton substitute paper so treated were placed one above the other and compressed between plates at 155° C. for 90 minutes under a specific pressure of 80 bars.

The laminated paper so obtained was transparent and had a yellow brown coloration.

EXAMPLE 2: (Comparative Example)

The procedure was as in Example 1 except that 26 g of antimony trioxide was additionally dispersed in the resin liquor containing the flame-proofing agent. The pulverulent antimony trioxide, which had a higher specific gravity, was distributed in the resin liquor by means of a stirrer. The resulting laminated paper was not transparent, and had a white to slightly yellow coloration.

EXAMPLE 3: (Comparative Example)

The procedure was as in Example 1 but 328 g of DUROPHEN VPP 93 and 24 g of 2,4-dibromopropyl phosphate were made into a resin liquor. The resulting laminated paper showed patches of deep brown coloration, which indicated that the flame-proofing agent had begun to undergo decomposition.

EXAMPLE 4: (Comparative Example)

The procedure was as in Example 1, but the resin liquor was prepared from 300 g DUROPHEN VPP 93 and 87 g of a plasticized melamine resin of 75% strength (MADURIT MW 811; this is a registered Trade Mark of Cassella Mainkur Aktiengesellschaft, Frankfurt am Main). The resulting laminated paper was transparent, and had a yellow coloration.

EXAMPLE 5: (Invention)

The procedure was as in Example 1, but the resin liquor was prepared from 373 g of DUROPHEN VPP 93 and 15 g of phosphorus pentanitride. The finely pulverulent phosphorus pentanitride, which had a very low specific gravity, wad distributed in the liquor by means of a dispersing stirrer.

The resulting laminated paper was not transparent, and had a yellow-brown coloration.

EXAMPLE 6: (Invention)

The procedure was as in Example 1, but 25 g of phosphorus pentanitride was used.

The resulting laminated paper was not transparent, and had a yellow-brown coloration.

EXAMPLE 7: (Comparative Example)

The procedure was as in Example 1, but the resin liquor was prepared from 405 g of PHENODUR PR 121 and 37.6 g of a bromine-containing epoxide resin (containing 49 weight % of bromine, based on tetrabromobisphenol A).

The resulting laminated paper was transparent, had a yellow-brown coloration, and was punchable only while hot.

EXAMPLE 8: (Invention)

The procedure was as in Example 1, but the resin liquor was prepared from 400 g of PHENODUR PR 121 and 28.9 g of phosphorus pentanitride.

The resulting laminated paper was not transparent, had a yellow-brown coloration, and was punchable only while hot.

The laminated papers made in Examples 1 to 8 had the properties indicated in Tables 1 and 2 hereinafter.

TABLE 1

| Example | 1 | 2 | 3 | 4 | 5 | 6 | 7 | 8 |
| --- | --- | --- | --- | --- | --- | --- | --- | --- |
| Total quantity of resin applied (%) | 106 | 104 | 103 | 113 | 110 | 109 | 105 | 107 |
| Thickness of laminate (mm) | 1.40 | 1.45 | 1.45 | 1.5 | 1.5 | 1.5 | 1.4 | 1.45 |
| Punch value at 20° C. (DIN 53488) | 1.7/1.8 | 1.7/1.7 | 2.5/2.3 | 3.2/3.0 | 2.1/2.0 | 2.2/2.0 | — | — |
| Water absorption (%) (DIN 53475) | 0.67 | 0.85 | 0.83 | 0.85 | 0.91 | 0.88 | 1.3 | 1.27 |
| Dielectric loss factor at 1 MHz $_{tg}$ (DIN 53481) | 0.044 / 5.1 | 0.045 / 5.3 | 0.065 / 5.7 | 0.052 / 5.3 | 0.048 / 5.3 | 0.051 / 5.4 | 0.050 / 5.8 | 0.047 / 5.7 |
| Electrolytic corrosion (DIN 53489) | AN 1.6 | AN 1.6 | AB 1.8 | AN 1.6 | AN 1.6 | AN 1.6 | AB 1.6 | AB 1.6 |
| Solder bath resistance (DIN 40802) | U* | U* | B** | U* | | U* | — | — |

*U = unchanged.
**B = brown coloration (deep brown in places) + formation of blisters.

TABLE 2

| Example | 1 | | 2 | | 3 | | 4 | | 5 | | 6 | | 7 | | 8 | |
| --- | --- | --- | --- | --- | --- | --- | --- | --- | --- | --- | --- | --- | --- | --- | --- | --- |
| | $t_1$ | $t_2$ | $t_1$ | $t_2$ | $t_1$ | $t_2$ | $t_1$ | $t_2$ | $t_1$ | $t_2$ | $t_1$ | $t_2$ | $t_1$ | $t_2$ | $t_1$ | $t_2$ |
| After-burning times (UL 94 V) (seconds) | 12 | 23 | 45 | 22 | 0 | 19 | 6 | 16 | 0 | 0 | 1 | 0 | 7 | 13 | 0 | 2 |

TABLE 2-continued

| Example | 1 | | 2 | | 3 | | 4 | | | 5 | | 6 | | 7 | | 8 |
|---|---|---|---|---|---|---|---|---|---|---|---|---|---|---|---|---|
| | 4 | 19 | 8 | 12 | 0 | 6 | 48 | 32 | 1.5 | 0 | 1 | 0 | 13 | 15 | 1 | 0 |
| | 28 | 26 | 4 | 50 | 0 | 9 | 11 | 19 | 1 | 1 | 1 | 3 | 8 | 15 | 0 | 2 |
| | 20 | 25 | 3 | 27 | 0 | 1 | 21 | 29 | 1 | 3 | 1 | 1 | 8 | 7 | 0 | 2 |
| | 26 | 11 | 19 | 29 | 0 | 0 | 40 | 25 | 1 | 1 | 0 | 0 | 9 | 6 | 2 | 2 |
| Sum of $t_1 + t_2$ (seconds) | 194 | | 219 | | 35 | | 247 | | | 9.5 | | 8 | | 101 | | 11 |
| Classified in burning class | V-1 | | V-1 | | V-0 | | V-1 | | | V-0 | | V-0 | | V-1 | | V-0 |

As Table 1 shows, the laminated papers of the invention are not adversely affected by the incorporation of phosphorus pentanitride. However, the phosphorus pentanitride gives these laminates an increased flame-resistance, so that they can be placed in burning class V-0, whereas the comparative laminates are placed in burning class V-1 (cf. Table 2), with the exception of the laminate of Comparative Example 3. Only the latter proves to be equivalent to the laminates of the invention in respect of flame-resistance, but it is discoloured with deep brown spots, which indicate decomposition of the flame-retardant agent.

We claim:

1. In a process for making a self-extinguishing synthetic resin laminate, wherein individual layers of a carrier material are impregnated with a thermosetting phenolic resin containing a flame-retardant agent and the impregnated layers are placed one above another and bonded together by compressing them at elevated temperature and under elevated pressure to give a hardened laminate, the improvement which comprises: dispersing finely pulverulent phosphorus pentanitride as a flame-retarding agent in the plasticized or non-plasticized thermosetting phenolic resin; the phenolic resin, based on its solid matter content, and the phosphorus pentanitride being used in an approximate ratio by weight of 100:4 to 100:15; and the phenolic resin, based on its solid matter content, and the carrier being used in an approximate ratio by weight of 100:80 to 100:150.

2. The process as claimed in claim 1, wherein the phenolic resin is a plasticized or non-plasticized thermosetting phenolic resol based on a synthetic phenol.

3. The process as claimed in claim 1, wherein the phenolic resin is diluted with methanol, ethanol, acetone, toluene or another solvent.

4. The process as claimed in claim 1, wherein the phenolic resin and phosphorus pentanitride are used in a ratio by weight of 100:6 to 100:10, based on the solid matter content of the resin.

5. The process as claimed in claim 1, wherein the phenolic resin and carrier are used in a ratio by weight of 100:100 to 100:130, based on the solid matter content of the resin.

6. The process as claimed in claim 1, wherein the carrier comprises cotton cellulose paper, sodium kraft paper or cotton fabric.

7. The process as claimed in claim 1, wherein the carrier is preimpregnated with a phenolic resin free from flame-retardant agent.

* * * * *